(12) United States Patent
Suzuki et al.

(10) Patent No.: US 7,919,192 B2
(45) Date of Patent: Apr. 5, 2011

(54) METAL MULTI-LAYERED FILM STRUCTURE AND METHOD OF MANUFACTURING AND USE OF THE SAME

(75) Inventors: Yoshio Suzuki, Tokyo (JP); Akira Suzuki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 241 days.

(21) Appl. No.: 11/837,254

(22) Filed: Aug. 10, 2007

(65) Prior Publication Data
US 2008/0038581 A1    Feb. 14, 2008

(30) Foreign Application Priority Data

Aug. 14, 2006  (JP) ................................ 2006-221058

(51) Int. Cl.
*B32B 15/08* (2006.01)
*B32B 15/04* (2006.01)

(52) U.S. Cl. ...... 428/626; 428/653; 428/336; 428/912.2; 204/192.15; 204/192.27; 204/192.26

(58) Field of Classification Search ................. None
See application file for complete search history.

(56) References Cited

U.S. PATENT DOCUMENTS 4,085,248 A * 4/1978 Zehender et al. ............. 428/336
4,105,821 A * 8/1978 Blaich et al. ................. 428/215

FOREIGN PATENT DOCUMENTS

JP            62089859    4/1987
WO        WO03/042423    5/2003

OTHER PUBLICATIONS

Ashmanis, I, et al., "High Corrosion Resistant Reflective Coatings," Proc. Annu. Tech. Conf. Soc. Vac. Coaters; Proceedings, Annual Technical Conference—Society of Vacuum Coaters, Albuquerque, NM, US, 1996, pp. 353-356.
Ma, E., et al., "Nucleation and growth during reactions in multilayer Al/Ni films: The early stage of Al3Ni formation," J. Appl. Physics USA, vol. 69, No. 4, Feb. 15, 1991, pp. 2211-2218, Am. Inst. of Physics, US.
Search Report for European Patent App. No. 07015895.1 (Aug. 27, 2008).

* cited by examiner

*Primary Examiner* — Aaron Austin
(74) *Attorney, Agent, or Firm* — Kenealy Vaidya LLP

(57) ABSTRACT

The disclosed subject matter relates to a metal multi-layered film structure that includes two types of metal films including first metal films and second metal films alternately formed on a resin substrate. The first metal films can be composed of an aluminum-based material having a film thickness between 0.7 nm and 20 nm. The second metal films can be composed of a metal selected from the group consisting of stainless steel-based materials, nickel-based materials, cobalt-based materials, titanium-based materials and chromium-based materials, having a film thickness ranging from 1 nm to 20 nm. This metal multi-layered film structure can be manufactured through a method of sputtering. The metal multi-layered film structure is suitable for an extension reflector for vehicular lamps.

22 Claims, 5 Drawing Sheets

METAL MULTI-LAYERED FILM STRUCTURE AND METHOD OF MANUFACTURING AND USE OF THE SAME

This application claims the priority benefit under 35 U.S.C. §119 of Japanese Patent Application No. 2006-221058 filed on Aug. 14, 2006, which is hereby incorporated in its entirety by reference.

BACKGROUND

1. Technical Field

The presently disclosed subject matter relates to a metal multi-layered film structure and method of forming the same, and more particularly to a metal multi-layered film structure formed on a resin substrate by sputtering and its related method of manufacturing. It also relates to an extension reflector for vehicles having the above-described metal multi-layered film structure.

2. Description of the Related Art

A conventional structure of a vehicular lamp is shown in FIG. 5. A lens cover 50 and a lamp body 51 form a lamp chamber 52, which houses a light source bulb 53 and a reflector 54 located around the light source bulb 53. The light L emitted from the light source bulb 53 toward the reflector 54 is reflected from the reflector 54 and released through the lens cover 50 to the front of the lamp.

When the above-configured vehicular lamp is observed from the front while the light source is turned off in the daytime, the lamp body 51 located behind a gap 55 formed between the reflector 54 and the lamp body 51 can be seen through the lens cover 50 and through the gap. This structure deteriorates the appearance of the lamp.

In particular, there is a vehicular lamp that includes a plurality of lamp bodies each including a separate light source bulb and reflector in combination within the lamp chamber. In such a case, the lamp body portion located behind the lamp reflectors can be seen through the gap formed between the reflectors and the lamp body portion, and additionally through the gap formed between adjacent reflectors. This structure further deteriorates the appearance of the lamp.

To prevent occurrence of such the problem, an extension reflector 56 is disposed within the lamp chamber 52 in a region relatively less related to the optical system. The extension reflector 56 covers the portion of the lamp body 51 that is located behind the reflector and is otherwise viewable, in order to enhance the appearance of the lamp. In addition, an observer can visually identify the extension reflector 56 because it receives extraneous light, thereby producing a refined appearance design for the lamp.

An enlarged view of an example of the general structure of the extension reflector 56 is shown in FIG. 5. The reflector 56 can include a resin substrate 60, on which an under coat 61 composed of an acrylic-based resin or the like for smoothing the rough surface of the resin substrate is applied and dried/cured. On the under coat, a coloring coat 62 for giving the lamp an upgraded image and for refining and chromatically differentiating the appearance and design of the lamp is applied and dried/cured. Further, on the color coat, a topcoat 63 for protection is applied and dried/cured to complete a multi-layered film structure.

Another example of forming a multi-layered film on a resin substrate is shown in FIG. 6. The film can include an ABS resin 70, on which a polyester urethane-based base coat 71 is applied and dried. On the base coat, a metal multi-layered film 72 is formed by forming $SiO_2$ (ceramic) films and Cu films alternately or simultaneously by sputtering. Further, an acrylic urethane-based topcoat 73 is applied on the metal multi-layered film and dried to complete a brilliant multi-layered film according to this method (see Japanese Patent Document 1: JP-A 62-89859, for example).

The multi-layered film structure shown in the enlarged view of FIG. 5 can include at least three coating steps for the under coat, the coloring coat and the protection film coat (topcoat). In addition, in the method shown in FIG. 5, time should be reserved for drying/curing after coating in each of the coating steps. Therefore, time and effort go into forming the multi-layered film which, in some circumstances, results in poor production efficiency when time and/or effort is/are deficient.

The formation of films through coating causes the multi-layered film structure to have a total film thickness of about 20 μm or more, which correspondingly increases the material expense and elevates the production cost.

The repetition of a series of coating steps including coating and drying/curing increases the degree of attachment of dirt and debris to the coated surface during the method and may lower the production yield.

An organic solvent may be used as a solvent for coating during the above-described manufacturing processes. However, it is desirable to reduce or hold back the use of organic solvents, not only from the viewpoint of environmental concerns but also from the viewpoint of protecting the health of workers.

On the other hand, as for the multi-layered film structure shown in FIG. 6, the base coat and the topcoat are formed by coating, and the metal multi-layered film composed of $SiO_2$ films and Cu films are formed by sputtering. Therefore, different types of facilities are often used in the forming of the multi-layered film, such as a coating facility and a sputtering facility, which increase the cost related to the production facilities. In addition, handling procedures for transportation between the different types of facilities lowers the production efficiency and yield, becoming a factor that also elevates the production cost.

The $SiO_2$ films and Cu films described in Japanese Patent Document No. JP-A 62-89859 referenced above both have a single-layered film thickness of around 50 nm, which is thicker as the film thickness formed by sputtering, and extends the time for film formation, correspondingly. Therefore, an increase in the number of film layer formations results in an elongated time for film formations and increasingly lowers the production efficiency.

SUMMARY

The presently disclosed subject matter is related to, for example, a metal multi-layered film structure on a resin substrate and method of manufacturing the same. Namely, the disclosed subject matter relates to a metal multi-layered film structure that can have one or more of the following characteristics: excellent durability; low material expense; safe working environment; a short production time; and an excellent yield.

The presently disclosed subject matter is directed to a metal multi-layered film structure that can include two types of metal films including first metal films and second metal films alternately formed on a resin substrate. The first metal films can be composed of an aluminum-based material having a film thickness ranging from 0.7 nm to 20 nm. The second metal films can be composed of a material selected from the group consisting of stainless steel-based materials, nickel-based materials, cobalt-based materials, titanium-based materials and chromium-based materials, having a film thickness ranging from 1 nm to 20 nm.

The metal multi-layered film structure includes a structure composed of metal films in two layers or more but not more than 100 layers. The metal multi-layered film structure can have a total thickness of 20-100 nm. It may partially exceed 100 nm in thickness if the film is formed on an item having a curved surface, such as an extension reflector.

The presently disclosed subject matter is also directed to a method of manufacturing a metal multi-layered film structure, that can include: providing a sputtering device including a substrate holder rotatably supported in a container; providing a plurality of cathodes fixedly arranged in the container, for attaching at least one resin substrate to the outer surface of the substrate holder; attaching two types of metal targets to the plurality of cathodes; providing an inert gas ambient in the container; and rotating the resin substrate-attached substrate holder about the central axis while sputtering the two types of metal targets to form metal films over the resin substrate sequentially and alternately.

In the above method, the inert gas can be an argon gas, wherein one of the metal targets is composed of an aluminum-based material, and the other of the metal targets is composed of one selected from the group consisting of stainless steel-based materials, nickel-based materials, cobalt-based materials, titanium-based materials and chromium-based materials, in one aspect.

The presently disclosed subject matter is further directed to an extension reflector for vehicular lamps having the above-described metal multi-layered film structure or a metal multi-layered film structure formed through the above-described method of manufacturing.

The presently disclosed subject matter makes it possible to form the metal multi-layered film on the resin substrate only by sputtering. As a result, the cost related to production facilities can be kept low and the reduction in the production efficiency and yield caused by handing between different types of facilities can be avoided. Accordingly, the production cost can be reduced.

The method of the presently disclosed subject matter can include no coating step in the film forming procedures, and the method in total can be performed in a vacuum container. Therefore, coating works and accompanying time for drying/curing are not required. Thus, it is possible to further improve the production efficiency, exclude the influence from floating matters such as dust and dirt, and form a reliable multi-layered film. In addition, not using any solvents can provide a better working environment that protects the health of workers.

The metal multi-layered film structure of the presently disclosed subject matter can include a single-layered film thickness of 20 nm or less for each metal. Therefore, even when an increased number of layers is used, the total film thickness can be kept to be around 20-100 nm, which is thinner than a typical coated film thickness. Accordingly, it is possible to enhance cost savings associated with reducing the material expense and the shortening of the film forming time.

DETAILED DESCRIPTION OF EXEMPLARY EMBODIMENTS

Figure 1:
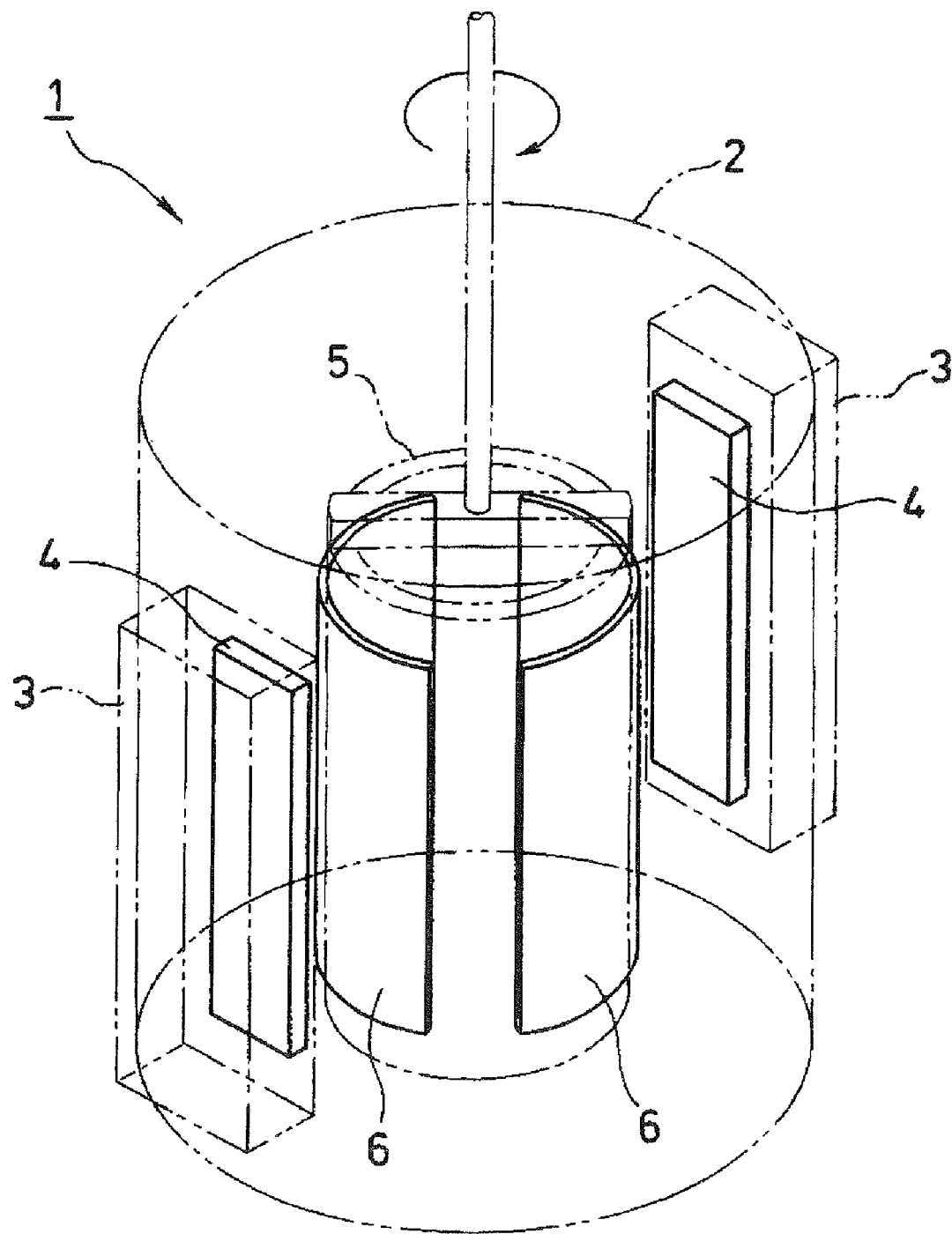
FIG. 1 is a schematic diagram of an exemplary embodiment of a film forming device made and used in accordance with principles of the presently disclosed subject matter.

FIG. 1 is a schematic diagram of an exemplary embodiment of a film forming device used in a method of manufacturing a metal multi-layered film structure in accordance with principles of the presently disclosed subject matter. The film forming device 1 uses a batch-type DC magnetron sputtering device. The device can include a vacuum container 2, and two cathodes 3, 3 fixedly supported thereon. Different types of metal targets 4, 4 are attached to the cathodes, respectively. A substrate holder 5 is rotatably supported opposed to both the metal targets 4, 4. Resin substrates 6, 6 for receiving films to be formed thereon are attached to the substrate holder. In FIG. 1, two cathodes and metal targets are respectively provided, though more than two may be provided, for example, four or six, etc. In FIG. 1, two resin substrates are provided even though more or less may be provided, for example one or three or more, etc.

The air is exhausted from inside the vacuum container 2 for depressurization to a certain pressure, then an inert gas is introduced into the vacuum container to replace the inside air thereof by an inert gas ambient.

Thereafter, metal atoms emitted from the metal targets 4 and spattered by ions of the inert gas are layered alternately on the resin substrates 6, 6 attached to the rotating substrate holder 5 to form a metal multi-layered film. This film is composed of two types of metal layers formed alternately on the resin substrate 6.

The first metal of the two types of metal targets is an aluminum-based material. The aluminum-based material may be high-purity aluminum or an aluminum alloy if it contains 90% or more aluminum. The second metal can be a stainless steel-based material. A typical example is SUS 304 that contains 18% chromium and 8% nickel in iron. In addition, SUS 304L, SUS 303, SUS 316L as well as SUS 300-series austenite-based material, SUS 430-containing ferrite-based material, and SUS 410-containing martensite-based material can be targeted. The second metal may also include, instead of the stainless steel-based material, a high heat resistive alloy such as a nickel-based alloy (for example, inconel, and hastelloy), a cobalt-based alloy (for example, stellite), a titanium-based material, a chromium-based material, and the like.

The aluminum-based material in the metal multi-layered film structure of the presently disclosed subject matter can have a single-layered film thickness of 0.7-20 nm, and possibly 0.7-10 nm. A film thickness thinner than 0.7 nm may result in shading or cracking during a heat resistance test. A film thickness thicker than 20 nm may result in a dropped part that may be whitened or vanished in an alkali resistance test. The layer composed of one selected from the group consisting of stainless steel-based materials, nickel-based materials, cobalt-based materials, titanium-based materials and chromium-based materials can have a single-layered film thickness of 1-20 nm, and possibly 1-10 nm. A film thickness thinner than 1 nm may result in a dropped part that may be whitened or vanished in an alkali resistance test. A film thickness thicker than 20 nm can result in shading or cracking which may occur during a heat resistance test.

Metal multi-layered films according to the presently disclosed subject matter include films that have 2-100 layers, and possibly 6-20 layers. Films that have more than 100 layers may cause a stress, which may lead to a distortion-related problem. The metal in the surface adjacent to the resin substrate may be either the first metal or the second metal. The resin substrate may be undercoated, if required, prior to formation of the multi-layered film thereon.

The multi-layered film can have a thickness of 20-100 nm. It may partially exceed 100 nm in thickness if the film is formed on an item having a curved surface, such as an extension reflector.

Specific and exemplary embodiments of the presently disclosed subject matter will now be described with reference to FIGS. 2-4 in detail (denoting the same parts with the same reference numerals). The below-described embodiments are examples of the presently disclosed subject matter and accordingly are given various technical features and characteristics. The scope of the presently disclosed subject matter should not be limited to these embodiments. The following Examples 1-4 describe examples that use an aluminum-based material as the first metal and a stainless steel as the second metal. A nickel-based material, a cobalt-based material, a titanium-based material or a chromium-based material may be used as the second metal instead of the stainless steel. It is easily understood such a film can be formed in a similar manner as described below with respect to Examples 1-4.

Example 1

Figure 2A:
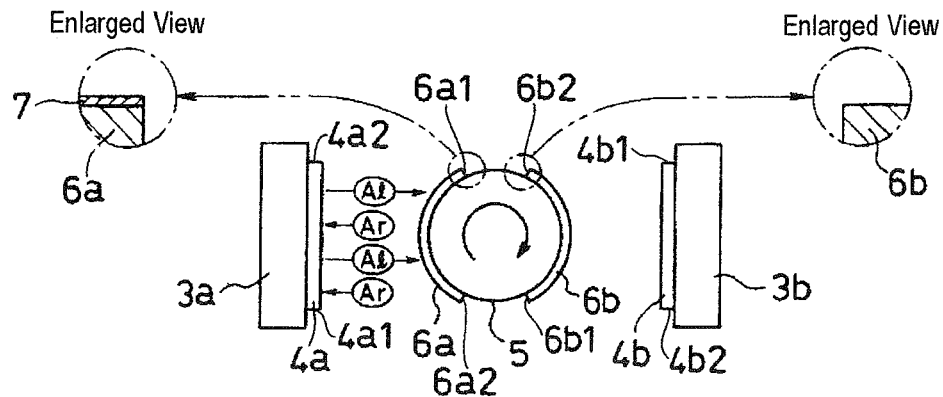
FIGS. 2(a)-(d) show exemplary process views of manufacturing a metal multi-layered film structure in accordance with principles of the presently disclosed subject matter.

FIGS. 2A-D show examples of a procedure for forming a metal multi-layered film structure in accordance with principles of the presently disclosed subject matter. The film forming procedures can be advanced in the order as shown in FIGS. 2A, B, C, D, and repeated. A vacuum container (not shown) houses the substrate holder 5 that is rotatably supported about the central axis, and two stationary cathodes 3a, 3b located outward from the substrate holder. An aluminum target 4a is attached to the cathode 3a while a stainless steel (SUS 304) target 4b is attached to the cathode 3b. Two polybuthylene terephthalate (PBT) substrates 6a, 6b are attached to the rotatably supported substrate holder 5.

The vacuum container is exhausted to $4\times10^{-3}$ Pa, then an argon (Ar) gas is introduce at a flow rate of 550 ccm to form an Ar ambient atmosphere inside the vacuum container.

FIG. 2A shows the state of forming an Al film on the PBT substrate 6a. When one end 6a1 of the PBT substrate 6a reaches a position opposite to one end 4a1 of the aluminum target 4a as the substrate holder 5 with the PBT substrates 6a, 6b attached thereto rotates, electrostatic discharge from the aluminum target 4a is started. During a period after the substrate holder 5 is started to rotate at the beginning of electrostatic discharge until the other end 6a2 of the PBT substrate 6a reaches a position opposite to the other end 4a2 of the aluminum target 4a, an aluminum (Al) film 7 is formed on the PBT substrate 6a.

Figure 2B:
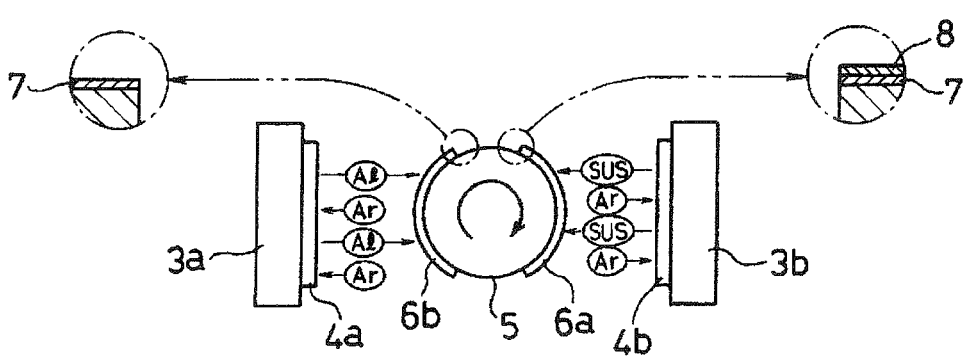

FIG. 2B shows the state of forming a stainless steel film on the Al film on the PBT substrate 6a and the state of forming an Al film on the PBT substrate 6b at the same time. When one end 6a1 of the PBT substrate 6a reaches a position opposite to one end 4b1 of the stainless steel target 4b as the substrate holder 5 rotates, electrostatic discharge from the stainless steel target 4b is started. During a period after the substrate holder 5 is started to rotate at the beginning of electrostatic discharge until the other end 6a2 of the PBT substrate 6a reaches a position opposite to the other end 4b2 of the stainless steel target 4b, a stainless steel (SUS) film 8 is additionally formed on the aluminum (Al) film 7 formed on the PBT substrate 6a. At the same time, an Al film 7 is formed on the PBT substrate 6b by electrostatic discharge from the aluminum target 4a.

Figure 2C:
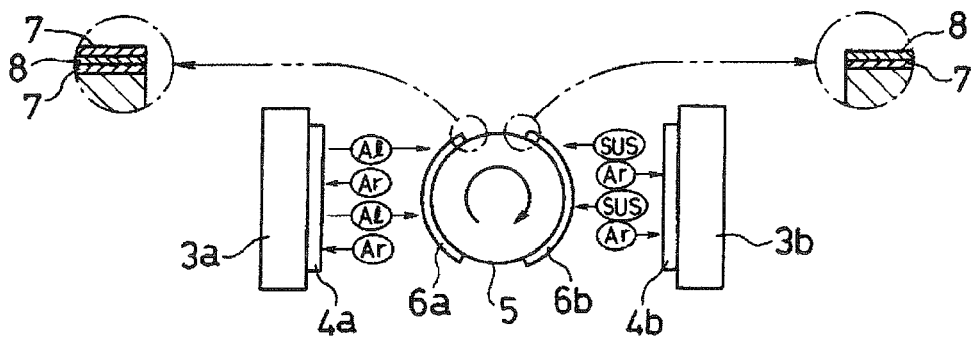

In FIG. 2C, when the PBT substrate 6a passes the position opposite to the aluminum target 4a and the PBT substrate 6b passes the position opposite to the stainless steel target 4b as the substrate holder 5 rotates, an Al film 7 is formed on the PBT substrate 6a and a SUS film 8 on the PBT substrate 6b.

Figure 2D:
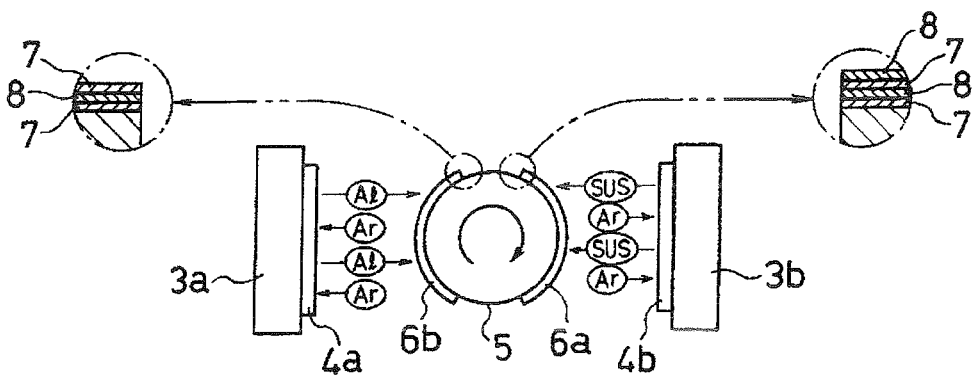

In FIG. 2D, when the PBT substrate 6a passes the position opposite to the stainless steel target 4b and the PBT substrate 6b passes the position opposite to the aluminum target 4a as the substrate holder 5 is rotated, a SUS film 8 is formed on the PBT substrate 6a and an Al film 7 on the PBT substrate 6b.

At the time of completion of the operation in FIG. 2D, a multi-layered film of 4 layers has been formed on the PBT substrate 6a, which includes the Al film 7, the SUS film 8, the Al film 7 and the SUS film 8 sequentially from the PBT substrate 6a. In addition, a multi-layered film of 3 layers has been formed on the PBT substrate 6b, which includes the Al film 7, the SUS film 8 and the Al film 7 sequentially from the PBT substrate 6b.

The above operation can be repeated to form a multi-layered film of 10 layers on each of the PBT substrates 6a, 6b attached to the rotating substrate holder 5 by forming Al films and SUS films both in 5 layers alternately.

In the film forming process, the number of revolutions of the substrate holder 5 can be 30 revolutions per minute, and the time for discharge from the targets 4a, 4b is about 10 seconds. The discharge power supplied to the targets during that time is DC 20 kW.

The multi-layered films formed on the PBT substrates 6a, 6b have a single-layered film thickness of 1.4 nm for the aluminum film, and 3.4 nm for the stainless film. The whole multi-layered film has a film thickness of 24 nm.

Example 2

The number of revolutions of the substrate holder 5 is set at 30 revolutions per minute, and the time for discharge from the targets 4a, 4b is set at about 20 seconds. During that time, Al films and SUS films are formed alternately each in 10 layers to form a multi-layered film of 20 layers. The discharge power supplied to the targets is set at DC 10 kW. Otherwise, the flow rate of the Ar gas introduced into the vacuum container and the materials of the targets can be the same as those in Example 1.

The multi-layered films formed on the PBT substrates have a single-layered film thickness of 0.7 nm for the aluminum film, and 1.7 nm for the stainless film. The whole multi-layered film has a film thickness of 24 nm.

Example 3

The number of revolutions of the substrate holder 5 is set at 15 revolutions per minute, and the time for discharge from the targets 4a, 4b is set at about 12 seconds. During that time, Al films and SUS films are formed alternately each in 3 layers to form a multi-layered film of 6 layers. The discharge power supplied to the targets is set at DC 20 kW. Otherwise, the flow rate of the Ar gas introduced into the vacuum container and the materials of the targets can be the same as those in Example 1.

The multi-layered films formed on the PBT substrates have a single-layered film thickness of 2.8 nm for the aluminum film, and 6.8 nm for the stainless film. The whole multi-layered film has a film thickness of 28.8 nm.

Example 4

The number of revolutions of the substrate holder 5 is set at 15 revolutions per minute, and the time for discharge from the targets 4a, 4b is set at about 40 seconds. During that time, Al films and SUS films are formed alternately each in 10 layers to form a multi-layered film of 20 layers. The discharge power supplied to the aluminum target is set at DC 20 kW and the discharge power supplied to the stainless steel target is set at DC 10 kW. Otherwise, the flow rate of the Ar gas introduced into the vacuum container and the materials of the targets can be the same as those in Example 1.

The multi-layered films formed on the PBT substrates have a single-layered film thickness of 2.8 nm for the aluminum film, and 3.4 nm for the stainless film. The whole multi-layered film has a film thickness of 62 nm.

The metal multi-layered film structure of the presently disclosed subject matter can be realized through the following methods, in addition to the batch method as in the above Examples. For example, an in-line, a turn-back, a cluster and other methods can be used if they can form films in multiple layers alternately on the resin substrate using the two types of metal targets. In the above Examples, the use of a cylindrical substrate holder is exemplified, though a system may be employed that rotates the substrate holder horizontally to achieve sputtering with the two types of metal targets fixedly installed. Alternatively, the two types of metal targets may be fixedly installed inside the vacuum container and the resin substrate holder can rotate around the targets.

Comparative Examples 1-4

Sputtering is applied to produce a single-layered aluminum film (film thickness: 50 nm) on a PBT substrate as Comparative Example 1; a single-layered stainless steel (SUS 304) film (film thickness: 50 nm) on a PBT substrate as Comparative Example 2; a single-layered chromium film (film thickness: 50 nm) on a PBT substrate as Comparative Example 3; a single-layered titanium film (film thickness: 50 nm) on a PBT substrate as Comparative Example 4.

Table 1 (below) shows test conclusions from a heat resistance test, a moisture proof test, a thermal cycle test and an alkali resistance test on the multi-layered metal films obtained in Examples 1-4 and the single-layered metal films obtained in Comparative Examples 1-4. The test conditions and the criteria of judgement for the test conclusions are as follows.

(1) Heat Resistance Test
  Test Condition: Left in an ambient at a temperature of 160° C. for 24 hours
  Criteria of Judgement (Surface Condition):
    ◎ mark—metallic luster; ○ mark—slightly shaded; Δ mark—shaded yellow; x mark—shaded/cracked (2) Moisture Proof Test
  Test Condition: Left in an ambient at a temperature of 50° C. and humidity of 98% for 240 hours
  Criteria of Judgement (Surface Condition):
    ◎ mark—metallic luster; Δ mark—white spots; x mark—whitened whole (3) Thermal Cycle Test
  Test Condition: Normal temperature→temperature of (−40° C.)→temperature of 80° C. and humidity of 98%, varied in a cycle over 8 hours, implemented 10 cycles over 80 hours
  Criteria of Judgement (Surface Condition):
    ◎ mark—metallic luster; Δ mark—shaded yellow; x mark—cracked (4) Alkali Resistance Test
  Test Condition: Immersed into a solution of 1% potassium hydroxide for 10 minutes, then washed with water
  Criteria of Judgement (Surface Condition):
    ◎ mark—metallic luster; ○ mark—slightly shaded at dropped parts; Δ mark—whitened at dropped parts; x mark—whitened/vanished at dropped parts

TABLE 1

| | | Test Conclusions | | | |
| --- | --- | --- | --- | --- | --- |
| Class. | NO. | Heat Resistance | Moisture Proof | Thermal Cycle | Alkali Resistance |
| Examples | 1 | ◎ | ◎ | ◎ | ◎ |
| | 2 | ○ | ◎ | ◎ | ◎ |
| | 3 | ◎ | ◎ | ◎ | ◎ |
| | 4 | ◎ | ◎ | ◎ | ○ |
| Comparative Examples | 1 | ◎ | X | Δ | X |
| | 2 | X | ◎ | ◎ | ◎ |
| | 3 | X | ◎ | ◎ | ◎ |
| | 4 | X | ◎ | ◎ | ◎ |

It can be found from Table 1 that Examples 1-4 of the presently disclosed subject matter have greatly improved performances, particularly in heat resistance, over Comparative Examples 1-4.

Figure 3:
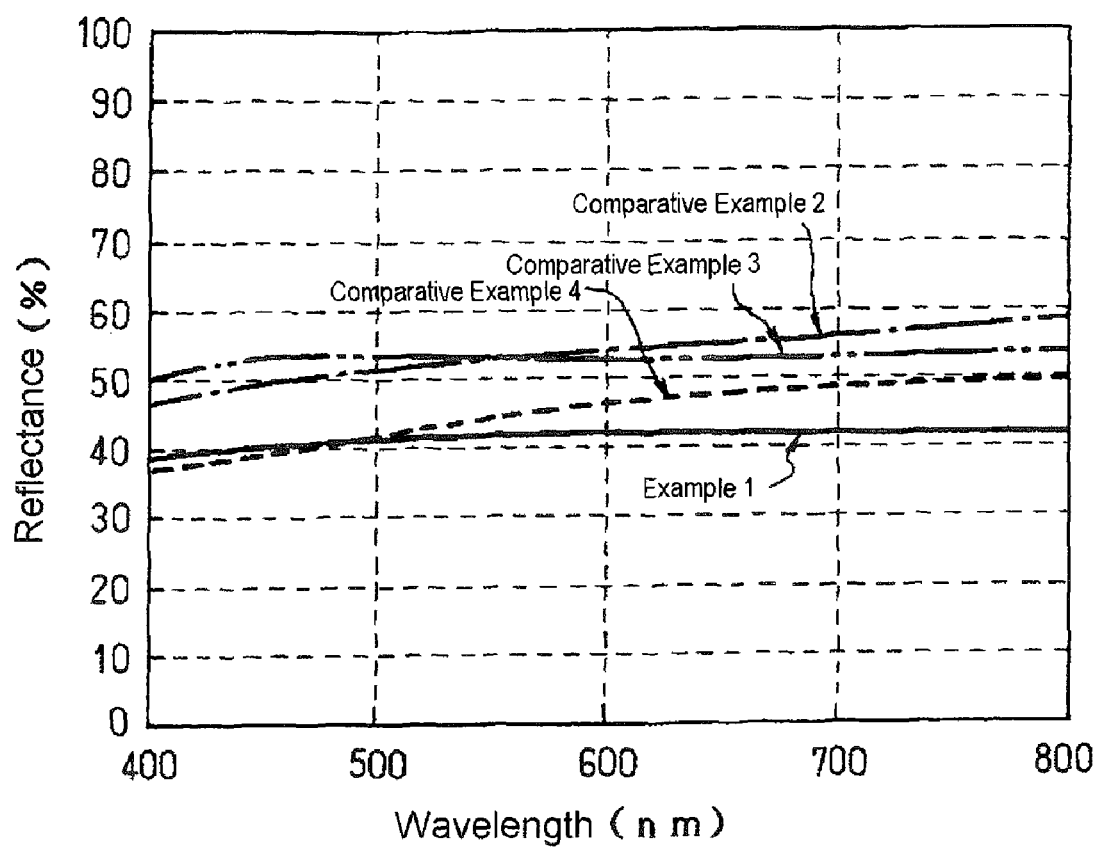
FIG. 3 shows a graph illustrative of spectroreflectance for Example 1 and Comparative Examples 2, 3, 4.

FIG. 3 shows graphs illustrative of spectroreflectance of the metal films obtained in Example 1 and Comparative Examples 2, 3 and 4. Example 1 shows reflectance unchanged over the whole visible light region. Therefore, it is possible to obtain a certain tinge with the depth of a metallic tone on observation of the metal film. In contrast, Comparative Example 2 composed of a single stainless steel film, Comparative Example 3 composed of a single chromium film, and Comparative Example 4 composed of a single titanium film have reflectance that is lowered in the short wave region within the visible light region. Accordingly, a yellow light having a complementary of a colored light in the short wave region is emphasized and deteriorates the design.

Figure 4A:
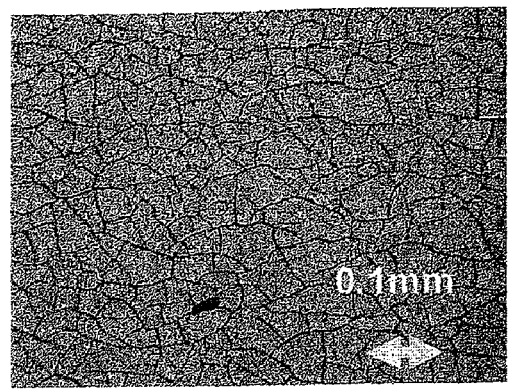
FIGS. 4(a)-(d) show metallurgical micrographs for Example 1 and Comparative Examples 2-4 after heat resistance tests.
Figure 4B:
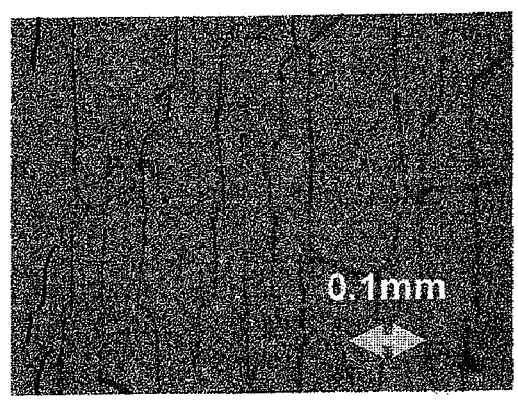
Figure 4C:
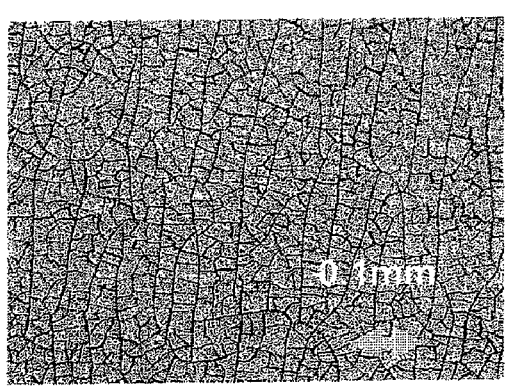
Figure 4D:
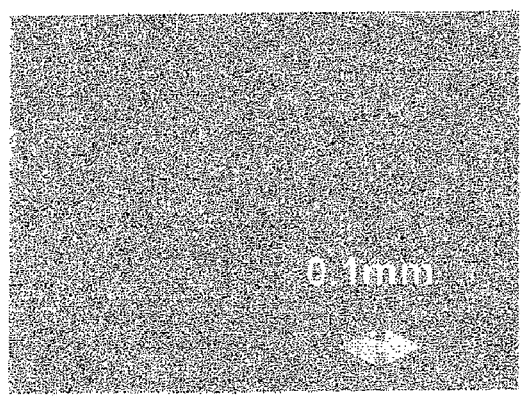
Figure 5:
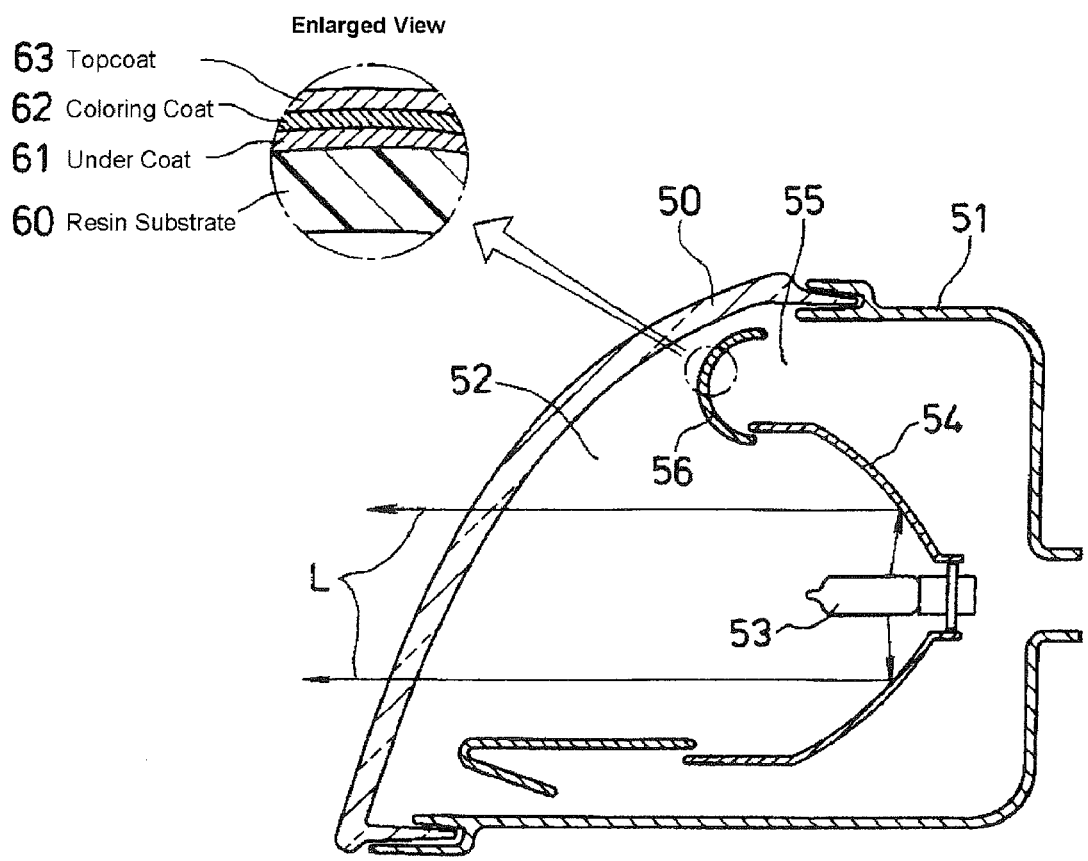
FIG. 5 is a cross-sectional view and enlarged view of a conventional art vehicular lamp.
Figure 6:
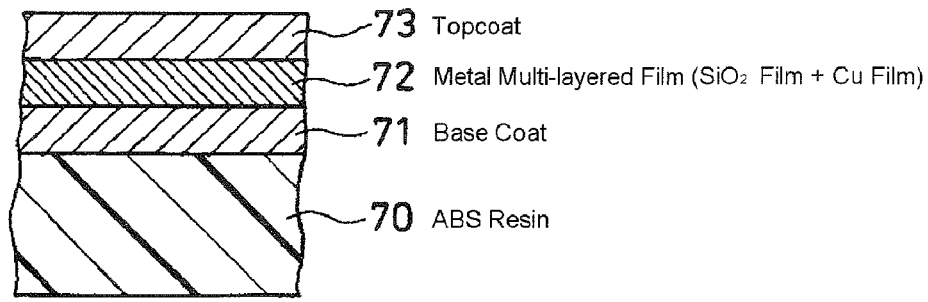
FIG. 6 is a cross-sectional view of a multi-layered film of the conventional art.

FIGS. 4(a)-(d) show photographs of the metal film-formed surfaces taken through a metallurgical microscope after heat resistance tests in which the metal films obtained in Example 1 and Comparative Examples 2, 3 and 4 are left in an ambient atmosphere at a temperature of 160° C. for 24 hours. FIG. 4A shows a microphotograph of Comparative Example 2, FIG. 4B that of Comparative Example 3, FIG. 4C that of Comparative Example 4, and FIG. 4D that of Example 1. Cracks are found in the film-formed surfaces of Comparative Examples 2-4 which are each composed of a single metal film. In contrast, cracks are hardly found in the metal multi-layered film structure of Example 1. Accordingly, it can be found that the metal multi-layered film structure makes it possible to achieve high-quality film formations.

The metal multi-layered film structure of the presently disclosed subject matter is applicable to reflectors and extension reflectors for vehicular lamps, reflectors for general illuminators, general decorative items, the decorative uses for machine devices, for noise-suppression applications, and so forth.

While there has been described what are at present considered to be exemplary embodiments of the invention, it will be understood that various modifications may be made thereto, and it is intended that the appended claims cover such modifications as fall within the true spirit and scope of the invention.

What is claimed is:

1. A multi-layered film structure, comprising:
   a resin substrate of a reflector portion;
   at least one first metal film formed adjacent the resin substrate of the reflector portion; and
   at least one stainless steel-based material formed adjacent the resin substrate of the reflector portion,
   wherein the at least one first metal film is composed of an aluminum-based material having a film thickness ranging from substantially 0.7 nm to 20 nm,
   wherein the at least one stainless steel-based material having a film thickness ranging from substantially 1 nm to 20 nm,
   wherein the multi-layered film structure, being formed on the resin substrate of the reflector portion, includes alternating layers of the at least one first metal film and the at least one stainless steel-based material and
   wherein a thickness of the stainless steel-based material is greater than that of the first metal film.

2. The multi-layered film structure according to claim 1, wherein the at least one first metal film is located proximate to the resin substrate.

3. The multi-layered film structure according to claim 2, wherein the metal multi-layered film structure includes at least two layers but not more than 100 layers of the at least one first metal film and the at least one stainless steel-based material.

4. An extension reflector for vehicular lamps having the multi-layered film structure according to claim 2.

5. The multi-layered film structure according to claim 2, wherein the multi-layered film has a thickness of 20-100 nm as a whole thereof.

6. The multi-layered film structure according to claim 2, wherein the first metal film is formed directly on the resin substrate.

7. The multi-layered film structure according to claim 1, wherein the at least one stainless steel-based material is located proximate to the resin substrate.

8. The multi-layered film structure according to claim 7, wherein the metal multi-layered film structure includes at least two layers but not more than 100 layers of the at least one first metal film and the at least one stainless steel-based material.

9. An extension reflector for vehicular lamps having the multi-layered film structure according to claim 7.

10. The multi-layered film structure according to claim 1, wherein the multi-layered film structure includes at least two layers but not more than 100 layers of the at least one first metal film and the at least one stainless steel-based material.

11. An extension reflector for vehicular lamps having the multi-layered film structure according to claim 10.

12. The multi-layered film structure according to claim 1, wherein the multi-layered film structure includes at least two first metal films and at least two stainless steel-based materials.

13. The multi-layered film structure according to claim 1, wherein the resin substrate is a polybuthylene terephthalate.

14. The multi-layered film structure according to claim 1, wherein the multi-layered film structure is formed as a vehicle lamp reflector portion.

15. An extension reflector for vehicular lamps having the multi-layered film structure according to claim 1.

16. The multi-layered film structure according to claim 1, wherein a material of the first metal film is a high-purity aluminum containing 90% or more aluminum or an aluminum alloy containing 90% or more aluminum.

17. The multi-layered film structure according to claim 1, wherein the stainless steel-based material is SUS 304 containing 18% chromium and 8% nickel in iron, SUS 304L, SUS 303, SUS 316L, SUS 300-series austenite-based material, SUS 430-containing ferrite-based material or SUS 410-containing martensite-based material.

18. A method of manufacturing the multi-layered film structure as recited in claim 1, comprising:
   providing a sputtering device including a substrate holder rotatably supported in a container, and a plurality of cathodes fixedly arranged in the container;
   attaching at least one substrate to the substrate holder;
   attaching two types of metal targets to the plurality of cathodes;
   providing an inert gas in the container; and
   rotating the substrate and substrate holder while sputtering the two types of metal targets to sequentially and alternately form metal films adjacent the substrate.

19. The method according to claim 18, wherein the inert gas is an argon gas, one of the metal targets is composed of an aluminum-based material, and the other of the metal targets is composed of a metal selected from the group consisting of stainless steel-based materials, nickel-based materials, cobalt-based materials, titanium-based materials and chromium-based materials.

20. The method according to claim 18, wherein the substrate holder includes an outer surface and the substrate is attached to the outer surface of the substrate holder.

21. The method according to claim 18, wherein the substrate holder has a central axis and rotating the substrate and substrate holder includes rotating the substrate and substrate holder about the central axis of the substrate holder.

22. The method according to claim 18, wherein attaching at least one substrate includes attaching at least one resin substrate.

* * * * *